United States Patent [19]

Ito et al.

[11] Patent Number: 4,737,438

[45] Date of Patent: Apr. 12, 1988

[54] NEGATIVE-WORKING PHOTOSENSITIVE COMPOSITION COMPRISING A DIPHENYLAMINE-MELAMINE CONDENSATE AND AN AZIDE COMPOUND

[75] Inventors: Naoki Ito, Samukawa; Koichiro Hashimoto, Chigasaki; Wataru Ishii, Hadano; Hisashi Nakane, Yokohama, all of Japan

[73] Assignee: Tokyo Ohka Kogyo Co., Ltd., Kanagawa, Japan

[21] Appl. No.: 921,790

[22] Filed: Oct. 21, 1986

[30] Foreign Application Priority Data

Oct. 30, 1985 [JP] Japan .................................. 60-241269

[51] Int. Cl.[4] .................................. G03C 1/52
[52] U.S. Cl. .................................. 430/197; 430/194
[58] Field of Search .................. 430/197, 194, 195

[56] References Cited

U.S. PATENT DOCUMENTS

| | | | |
|---|---|---|---|
| 3,143,423 | 8/1964 | Reynolds et al. | 430/197 |
| 3,402,044 | 9/1968 | Steinhoff et al. | 430/192 |
| 3,595,656 | 7/1971 | Ruckert et al. | 430/197 |
| 3,779,758 | 12/1973 | Polichette | 430/197 |
| 3,867,147 | 2/1975 | Teuscher | 430/302 |
| 3,869,292 | 3/1975 | Peters | 430/197 |
| 4,164,422 | 8/1979 | Okai et al. | 430/302 |
| 4,551,409 | 11/1985 | Gulla et al. | 430/197 |
| 4,579,804 | 4/1986 | Takeuchi et al. | 430/177 |

FOREIGN PATENT DOCUMENTS

| | | | |
|---|---|---|---|
| 2757056 | 10/1978 | Fed. Rep. of Germany | 430/194 |
| 1036742 | 2/1986 | Japan | 430/270 |

*Primary Examiner*—Paul R. Michl
*Assistant Examiner*—Terri Stevenson
*Attorney, Agent, or Firm*—Hopgood, Calimafde, Kalil, Blaustein & Judlowe

[57] ABSTRACT

The negative-working photosensitive composition of the invention, which is suitable as a photoresist material in the photolithographic processing of semiconductor devices, comprises (a) a condensation product of a hydroxy-substituted diphenylamine compound such as 4-hydroxy diphenylamine and a methylol melamine or alkoxylated methylol melamine by the reaction in a medium of phosphoric or sulfuric acid and (b) an azide compound capable of strongly absorbing UV or far UV light. The composition gives a photoresist layer having high resistance against heat in the post-baking and the attack of gas plasma encountered in the dry etching for semiconductor processing.

7 Claims, No Drawings

NEGATIVE-WORKING PHOTOSENSITIVE COMPOSITION COMPRISING A DIPHENYLAMINE-MELAMINE CONDENSATE AND AN AZIDE COMPOUND

BACKGROUND OF THE INVENTION

The present invention relates to a negative-working photosensitive composition or, more particularly, to a negative-working photosensitive composition sensitive to ultraviolet and far ultraviolet light and suitable for forming a finely patterned photoresist layer having excellent heat resistance against heat and dry etching.

As is well known, the process of fine patterning in the manufacture of semiconductor devices such as integrated circuits involves the techniques of photolithography, in which a semiconductor silicon wafer having a surface film of an oxide or nitride is first coated with a solution of a photoresist composition followed by drying to form a photoresist film thereon. Thereafter, a photomask bearing a desired pattern is laid on the photoresist film which is exposed to actinic rays through the photomask followed by a treatment of developing to form a finely patterned photoresist layer. The surface film of oxide or nitride in the thus uncovered areas is then subjected to etching to have the underlying surface of silicon exposed bare which is doped with a dopant by diffusion after removal of the photoresist layer. Semiconductor devices are finished by repeating the above described procedures to form a desired electric circuit with adjunction of necessary parts such as electrodes.

The photoresist materials used in the above described photolithographic process are classified into positive-working ones, of which the solubility in a developer solution is increased by exposure to actinic rays so that the photoresist layer is dissolved away by the developer solution in the exposed areas, and negative-working ones, of which the solubility in a developer solution is decreased by exposure to actinic rays so that the photoresist layer is dissolved away by the developer solution in the unexposed areas. A typical positive-working photoresist material is a photosensitive composition comprising a novolac resin and an o-quinone diazide compound and typical negative-working photoresist materials include cyclized rubber-based photosensitive compositions comprising a cyclized rubber as the polymeric base ingredient admixed with a photosensitive bisazide compound and poly(vinyl cinnamate)-based photosensitive compositions prepared from polyvinyl alcohol and cinnamyl chloride.

Turning now to the procedure of etching in the processing of semiconductor devices, it is a trend in recent years that the conventional wet-etching process using an etching solution is increasingly being replaced with the dry-etching process utilizing gas plasma in view of several advantages over the wet process. A problem in the dry-etching process, however, is the poor resistance of the negative-working photoresist materials against the attack of the gas plasma in the etching in comparison with the positive-working ones and none of the conventional negative-working photoresist materials can give quite satisfactory results. Although many of the negative-working photoresist materials are superior to positive-working ones in respect of the heat resistance, the heat resistance of conventionally available negative-working photoresist materials is still insufficient to comply with the processing conditions in the modern manufacturing process of semiconductor devices.

SUMMARY OF THE INVENTION

The present invention completed as a result of the investigations undertaken in view of the above described prior art problems accordingly has an object to provide a photosensitive composition suitable as a negative-working photoresist material usable for forming a finely patterned photoresist layer capable of exhibiting high heat resistance to withstand the thermal conditions in the post-baking treatment and excellent resistance against the attack of a plasma gas in the dry etching.

The photosensitive composition of the present invention to achieve the above mentioned object comprises:
(a) a condensation product of a hydroxy-substituted diphenylamine compound of the formula $$C_6H_5-NH-C_6H_{5-n}(OH)_n, \quad (I)$$

in which n is 1 or 2, and a methylol melamine or alkoxylated methylol melamine compound; and
(b) an azide compound having strong absorption of light in the wave length region of ultraviolet or far ultraviolet.

DETAILED DESCRIPTION OF THE PREFERRED EMBODIMENTS

As is understood from the above given summary of the invention, the polymeric base ingredient in the inventive photosensitive composition is the component (a) which is a condensation product of a hydroxy-substituted diphenylamine compound and an optionally alkoxylated methylol melamine compound. Such a condensation product can readily be prepared by the condensation reaction of the reactants in the presence of an acid catalyst.

The hydroxy-substituted diphenylamine compound in conformity with the above given formula (I) is exemplified by 2-, 3- and 4-hydroxy diphenylamines, 2,4- and 3,5-dihydroxy diphenylamines and the like. These diphenylamine compounds can be used either singly or as a combination of two kinds or more according to need.

The other reactant to be condensed with the above mentioned hydroxy-substituted diphenylamine compound is a methylol melamine or alkoxylated methylol melamine compound. The methylol melamine compound can be prepared according to a known method by the methylolation reaction of melamine with formaldehyde and the alkoxylated methylol melamine compound can be obtained by the alkoxylation of a methylol melamine with an alcohol having 1 to 4 carbon atoms in a molecule. Accordingly, the optionally alkoxylated methylol melamine compound is represented by the general formula

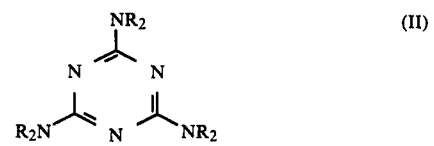
(II)

in which each of the groups denoted by R is, independently from the others, a hydrogen atom, a methylol group or an alkoxy-substituted methyl group having 1 to 4 carbon atoms in the alkoxy group, at least one of the groups denoted by R in a molecule being a methylol group. The methylol melamine compound of the general formula (II) can be in the monomeric form or in a dimeric or trimeric form. Mixtures of these monomeric and oligomeric forms can of course be used.

The optionally alkoxylated methylol melamine compound in conformity with the general formula (II) is exemplified by penta(butoxymethyl) monomethylol melamine, tri(methoxymethyl) monomethylol melamine, di(methoxymethyl) monomethylol melamine, trimethylol melamine, hexamethylol melamine and the like. These methylol melamine compounds can be used either singly or as a combination of two kinds or more according to need. It is of course optional that the oligomeric form of the methylol melamine compound is a mixed condensation product of different kinds of these methylol melamine compounds.

The condensation reaction of the hydroxy-substituted diphenylamine compound and the methylol melamine compound is performed in the presence of an acid catalyst such as phosphoric acid, sulfuric acid and the like or, rather, in these acids as a reaction medium. For example, the starting reactants are added to and dissolved in phosphoric or sulfuric acid and the reaction mixture is heated at 30° to 100° C. for 2 to 100 hours and then poured into a large volume of water to precipitate the polymeric material which is collected by filtration, washed with water and dried to give the desired condensation product. The amounts of the starting reactants used in this condensation reaction is usually such that the weight proportion of the melamine compound to the hydroxy-containing diphenylamine compound should be in the range from 1:99 to 60:40 or, preferably, from 25:75 to 55:45. When the amount of the melamine compound is too large, the reaction mixture is sometimes gelled as the condensation reaction proceeds or, if not gelled, the solubility of the resultant condensation product may be somewhat decreased to cause disadvantages. When the amount of the melamine compound is too small, on the other hand, the condensation product would have an unduly increased solubility also to cause some disadvantages although the reaction mixture is free from gelation.

The other essential ingredient in the inventive photosensitive composition as the component (b) besides the above described condensation product as the component (a) is an azide compound having strong absorption of light in the wave length region of ultraviolet or far ultraviolet. Exemplary of such an azide compound are 4,4'-diazidodiphenyl ether, 4,4'-diazidodiphenyl methane, 3,3'-dichloro-4,4'-diazidodiphenyl methane, 4,4'-diazidodiphenyl sulfide, 4,4'- and 3,3'-diazidodiphenyl sulfones, 4,4'- and 2,2'-diazidostilbenes, 4,4'-diazidochalcone, 4,4'-diazidobenzal acetone, 4,4'-diazidobenzylidene acetone, 2,6-di(4'-azidobenzal) cyclohexanone, 2,6-di(4'-azidobenzal)-4-methyl cyclohexanone, 2,6-di(4'-azidocinnamylidene) cyclohexanone, 4,4'-diazidobiphenyl, 3,3'-dimethyl-4,4'-diazidobiphenyl, 1-azidonaphthalene, 1-azidoanthracene, 1-azidophenanthrene, 1-azidopyrene, 1,8-diazidonaphthalene and the like, of which 4,4'-diazidodiphenyl ether, 4,4'-diazidodiphenyl methane, 4,4'-diazidodiphenyl sulfide and 4,4'- and 3,3'-diazidodiphenyl sulfones are particularly preferred. The amount of the azide compound as the component (b) in the inventive photosensitive composition should usually be in the range from 0.5 to 50% by weight based on the condensation product as the component (a).

The photosensitive composition of the invention may be further admixed with various kinds of known additives conventionally added to photosensitive compositions such as photosensitizers, coloring agents, stabilizers and the like according to need.

The photosensitive composition of the invention is prepared usually and preferably in the form of a solution by dissolving the above described components (a) and (b) in a suitable organic solvent exemplified by polar solvents such as N-methyl-2-pyrrolidone, N-acetyl-2-pyrrolidone, dimethyl sulfoxide, dimethyl acetamide and dimethyl formamide as well as mixtures thereof with optional admixture of a small amount of another solvent which is miscible with the above mentioned polar solvent though without dissolving power for the condensation product.

To describe a practical way of using the inventive photosensitive composition in the processing of semiconductor devices, the inventive photosensitive composition in the form of a solution is first applied uniformly to the surface of a substrate such as a silicon wafer by use of a spinner followed by drying to form a photoresist layer which is then exposed patternwise to ultraviolet or far ultraviolet light through a photomask bearing a desired pattern and developed with a developer solution so that the photoresist layer in the unexposed areas is dissolved away to leave a negatively patterned photoresist layer with high fidelity of the pattern to the pattern on the photomask.

The developer solution used in the development above mentioned should be an aqueous solution containing an inorganic or organic alkaline compound or a certain organic solution. The inorganic alkaline compound is exemplified by sodium hydroxide, sodium metasilicate, sodium phosphate and the like and the organic alkaline compound is exemplified by tetramethyl ammonium hydroxide, trimethyl hydroxyethyl ammonium hydroxide and the like. These alkaline compounds can be used either singly or as a combination of two kinds or more according to need. When the developer solution is organic, the organic solvent used to dissolve the alkaline compound may be a polar organic solvent such as N-methyl-2-pyrrolidone, N-acetyl-2-pyrrolidone, dimethyl sulfoxide, dimethyl acetamide, dimethyl formamide and the like as well as solvent mixtures of these polar organic solvents with other organic solvents having miscibility therewith. The organic solvents miscible with the above mentioned polar organic solvents include acetone, methyl ethyl ketone, methyl alcohol, ethyl alcohol, isopropyl alcohol, ethyleneglycol monomethyl ether, ethyleneglycol monoethyl ether, ethyleneglycol monomethyl ether acetate, ethyleneglycol monoethyl ether acetate and the like. The addition of these solvents to the polar organic solvent is sometimes preferable since such a mixed solvent is effective in adequately controlling the dissolution of the photoresist layer not to be dissolved away in the areas exposed to light.

The above described negative-working photosensitive composition is suitable for use as a photoresist material capable of forming a very finely patterned photoresist layer having markedly improved resistance against heat encountered in the post-baking treatment and the attack of gas plasma in the process of dry etching in comparison with conventional negative-working photosensitive compositions.

In the following, the negative-working photosensitive compositions of the invention are described in more detail by way of examples.

EXAMPLE 1

A condensation reaction was performed by admixing a solution of 585 g of 4-hydroxy diphenylamine in 2540 g of 85% phosphoric acid with an aqueous solution of 390 g of trimethylol melamine dissolved in 390 g of water followed by heating the reaction mixture at 50° C. for 72 hours. After completion of the reaction, the reaction mixture was poured into 15 liters of water and the precipitates were collected by filtration, thoroughly washed with water and dried to give the condensation product in a powdery from.

A photosensitive composition was prepared by dissolving 30 parts by weight of the thus obtained condensation product and 6 parts by weight of 4,4'-diazidodiphenyl sulfide in 100 parts by weight of N,N-dimethyl acetamide.

The photosensitive composition in the form of a solution was applied to the surface of a semiconductor silicon wafer of 3 inch diameter on a spinner at 1500 rpm for 40 seconds and then the silicon wafer was prebaked on a hot plate at 110° C. for 5 minutes to give a uniform photoresist layer having a thickness of 1.06 $\mu$m. The photoresist layer on the silicon wafer was exposed to ultraviolet by hard-contacting of a photomask and developed with a developer solution, which was a 2.38% by weight aqueous solution of tetramethyl ammonium hydroxide, at 23° C. for 1 minute followed by rinse in pure water for 30 seconds to give a negatively patterned photoresist layer.

The silicon wafer thus provided with the patterned photoresist layer was subjected to post-baking at 200° C. for 5 minutes to find that the photoresist layer was stable without showing noticeable deformation in the cross sectional form of the patterned lines.

The silicon wafer thus provided with the patterned photoresist layer after the post-baking treatment was then subjected to dry etching with plasma of a 94:6 by volume mixture of carbon tetrafluoride and oxygen gases under a pressure of 0.4 Torr for 1 minute with an electric output of 200 watts keeping the table at 100° C. to find that the decrease in the thickness of the photoresist layer was only about 30 nm.

COMPARATIVE EXAMPLE 1

A silicon wafer was coated on a spinner with a commercial product of a cyclized rubber-based photoresist composition (OMR-83, a product by Tokyo Ohka Kogyo Co.) and prebaked for 90 seconds on a hot plate kept at 110° C. to form a photoresist layer having a thickness of 1.0 $\mu$m. Exposure of the photoresist layer to ultraviolet and subsequent development were undertaken in substantially the same manner as in Example 1 except that the developer solution and the rinse liquid were each a commercial product recommended by the manufacturer of the photoresist composition to give a negatively patterned photoresist layer.

The silicon wafer provided with the patterned photoresist layer was post-baked for 5 minutes on a hot plate kept at 170° C. to find some dullness in the shoulder portions in the cross section of the patterned photoresist lines.

COMPARATIVE EXAMPLE 2

A silicon wafer was coated with a commercial product of a positive-working photoresist composition (OFPR-800, a product by Tokyo Ohka Kogyo Co.) on a spinner and pre-baked for 90 seconds on a hot plate kept at 110° C. to form a photoresist layer having a thickness of 1.3 $\mu$m. The photoresist layer on the silicon wafer was subjected to dry etching in the same manner as in Example 1 to find that the thickness of the photoresist layer was decreased by about 100 nm.

EXAMPLE 2

A condensation reaction was performed by admixing a solution of 160 g of 4-hydroxy diphenylamine and 20 g of 3-hydroxy diphenylamine in 730 g of 85% phosphoric acid with 100 g of trimethylol melamine and heating the mixture at 50° C. for 6 hours. After completion of the reaction, the reaction mixture was poured into 4 liters of water and the precipitates were collected by filtration, thoroughly washed with water and dried to give the condensation product in a powdery form.

A photosensitive composition was prepared by dissolving 30 parts by weight of the thus obtained condensation product and 5 parts by weight of 4,4'-diazidodiphenyl sulfone in 100 parts by weight of N,N-dimethyl acetamide.

A semiconductor silicon wafer of 3 inch diameter was coated with this photosensitive composition to form a photoresist layer having a thickness of 1.0 $\mu$m followed by a pre-baking treatment, exposure to light and development under the same conditions as in Example 1 excepting extension of the development time to 75 seconds to give a negatively patterned photoresist layer.

A post-baking treatment of this silicon wafer provided with the patterned photoresist layer indicated substantially no deformation in the cross section of the patterned lines of the photoresist layer after 5 minutes on a hot plate kept at 200° C. Further, the silicon wafer was subjected to dry etching in the same manner as in Example 1 to find that the decrease in the thickness of the photoresist layer was about 40 nm.

EXAMPLE 3

A condensation reaction was performed by admixing a solution of 200 g of 4-hydroxy diphenylamine and 50 g of 3,5-dihydroxy diphenylamine in 1000 g of 98% sulfuric acid with 140 g of di(methoxymethyl) monomethylol melamine and heating the mixture at 60° C. for 60 hours. After completion of the reaction, the reaction mixture was poured into 5 liters of water and the precipitates were collected by filtration, thoroughly washed with water and dried to give the condensation product in a powdery form.

A photosensitive composition was prepared by dissolving 30 parts by weight of the thus obtained condensation product and 10 parts by weight of 4,4'-diazidodiphenyl sulfide in 100 parts by weight of N,N-dimethyl acetamide.

A semiconductor silicon wafer of 3 inch diameter was coated with this photosensitive composition to form a photoresist layer having a thickness of 1.1 $\mu$m followed by a pre-baking treatment, exposure to light and development under the same conditions as in Example 1 except that the development was performed for 45 seconds with a 1% by weight aqueous solution of sodium hydroxide as the developer solution to give a negatively patterned photoresist layer.

A post-baking treatment of this silicon wafer provided with the patterned photoresist layer indicated substantially no deformation in the cross section of the patterned lines of the photoresist layer after 5 minutes on a hot plate kept at 200° C. Further, the silicon wafer was subjected to dry etching in the same manner as in Example 1 to find that the decrease in the thickness of the photoresist layer was about 40 nm.

EXAMPLE 4

A condensation reaction was performed by admixing a solution of 50 g of 2-hydroxy diphenylamine and 150 g of 2,4-dihydroxy diphenylamine in 860 g of 85% phosphoric acid with 140 g of trimethylol melamine and heating the mixture at 50° C. for 6 hours. After completion of the reaction, the reaction mixture was poured into 4 liters of water and the precipitates were collected by filtration, thoroughly washed with water and dried to give the condensation product in a powdery form.

A photosensitive composition was prepared by dissolving 30 parts by weight of the thus obtained condensation product and 5 parts by weight of 4,4'-diazidodiphenyl sulfide in 100 parts by weight of N,N-dimethyl acetamide.

A semiconductor silicon wafer of 3 inch diameter was coated with this photosensitive composition to form a photoresist layer having a thickness of 1.0 μm followed by a pre-baking treatment, exposure to light and development under the same conditions as in Example 1 to give a negatively patterned photoresist layer.

A post-baking treatment of this silicon wafer provided with the patterned photoresist layer indicated substantially no deformation in the cross section of the patterned lines of the photoresist layer after 5 minutes on a hot plate kept at 200° C. Further, the silicon wafer was subjected to dry etching in the same manner as in Example 1 to find that the decrease in the thickness of the photoresist layer was about 40 nm.

What is claimed is:

1. A negative-working photosensitive composition which comprises in admixture:
   (a) a condensation product of a hydroxy-substituted diphenylamine compound represented by the general formula

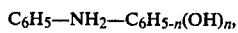
   $$C_6H_5-NH_2-C_6H_{5-n}(OH)_n,$$

in which n is 1 or 2, and a methylol melamine compound or an alkoxylated methylol melamine compound; and
   (b) a photosensitive azide compound, the amount of azide being in the range from 0.5 to 50 percent by weight of the amount of the condensation product of component (a).

2. The negative-working photosensitive composition as claimed in claim 1 wherein the condensation product as the component (a) is prepared by the condensation reaction of a hydroxy-substituted diphenylamine compound and a methylol melamine compound or an alkoxylated methylol melamine compound in an acid as a reaction medium.

3. The negative-working photosensitive composition as claimed in claim 2 wherein the hydroxy-substituted diphenylamine compound is selected from the group consisting of 2-, 3-, and 4-hydroxy diphenylamines and 2,4- and 3,5-dihydroxy diphenylamines.

4. The negative-working photosensitive composition as claimed in claim 2 wherein the methylol melamine compound or the alkoxylated methylol melamine compound is selected from the group consisting of penta(-butoxymethyl) monomethylol melamine, tri(methoxymethyl) monomethylol melamine, di(methoxymethyl) monomethylol melamine, trimethylol melamine and hexamethylol melamine.

5. The negative-working photosensitive composition as claimed in claim 2 wherein the acid as the reaction medium is phosphoric acid or sulfuric acid.

6. The negative-working photosensitive composition as claimed in claim 1 wherein the azide compound as the component (b) is selected from the group consisting of 4,4'-diazidodiphenyl ether, 4,4'-diazidodiphenyl methane, 3,3'-dichloro-4,4'-diazidodiphenyl methane, 4,4'-diazidodiphenyl sulfide, 4,4'- and 3,3'-diazidodiphenyl sulfones, 4,4'- and 2,2'-diazidostilbenes, 4,4'-diazidochalcone, 4,4'-diazidobenzal acetone, 4,4'-diazidobenzylidene acetone, 2,6-di(4'-azidobenzal) cyclohexanone, 2,6-di(4'-azidobenzal)-4-methyl cyclohexanone, 2,6-di(4'-azidocinnamylidene) cyclohexanone, 4,4'-diazidobiphenyl, 3,3'-dimethyl-4,4'-diazidobiphenyl, 1-azidonaphthalene, 1-azidoanthracene, 1-azidophenanthrene, 1-azidopyrene and 1,8-diazidonaphthalene.

7. The negative-working photosensitive composition as claimed in claim 6 wherein the azide compound is selected from the group consisting of 4,4'-diazidodiphenyl ether, 4,4'-diazidodiphenyl methane, 4,4'-diazidodiphenyl sulfide and 4,4'- and 3,3'-diazidodiphenyl sulfones.

* * * * *